(12) United States Patent
Barsukov

(10) Patent No.: US 8,242,738 B2
(45) Date of Patent: Aug. 14, 2012

(54) SYSTEMS AND METHODS FOR DETERMINING BATTERY PARAMETERS FOLLOWING ACTIVE OPERATION OF THE BATTERY

(75) Inventor: Yevgen Pavlovich Barsukov, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 687 days.

(21) Appl. No.: 12/128,245

(22) Filed: May 28, 2008

(65) Prior Publication Data
US 2009/0295397 A1    Dec. 3, 2009

(51) Int. Cl.
*H02J 7/00* (2006.01)
(52) U.S. Cl. .................................. 320/106; 324/427
(58) Field of Classification Search .................. 320/106
See application file for complete search history.

(56) References Cited

U.S. PATENT DOCUMENTS

| | | | |
|---|---|---|---|
| 4,672,502 A * | 6/1987 | Reichart | 361/101 |
| 6,094,033 A * | 7/2000 | Ding et al. | 320/132 |
| 2003/0052645 A1* | 3/2003 | Sasaki | 320/110 |
| 2007/0145953 A1* | 6/2007 | Asai et al. | 320/149 |

* cited by examiner

*Primary Examiner* — Arun Williams
(74) *Attorney, Agent, or Firm* — William B. Kempler; Wade J. Brady III; Frederick J. Telecky, Jr.

(57) ABSTRACT

When the load of a battery powered device is removed or significantly reduced, the voltage response may be recorded or analyzed in real time. The parameters of a battery's equivalent circuit can be found by fitting recorded or real time voltage response to a model function. The model function may describe the equivalent circuit voltage response to the load transition through equivalent circuit parameters. The model function may account for a duration of a load application prior to a transition as well as values of the load before and after the transition. Response of battery voltage to load application or load release is time dependent. Modeling of this time dependence can provide significant advantages in fuel gauging implementation, for example, to significantly reduce the waiting time before measured voltages can be used for state of charge (SOC) correlation and to improve the accuracy of the prediction of run-time for devices that drain a battery in short high-current pulses.

20 Claims, 4 Drawing Sheets

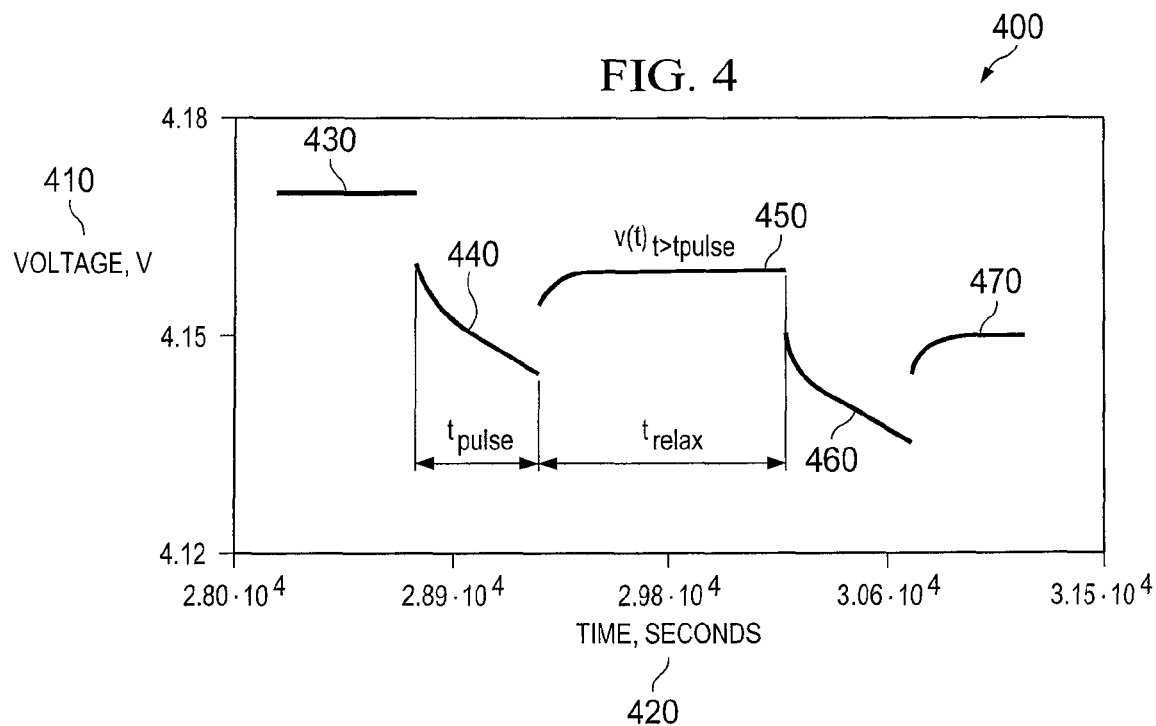
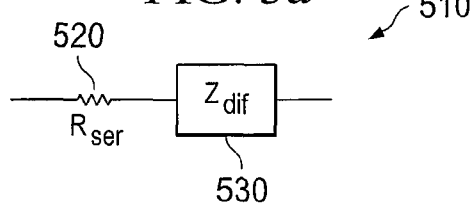
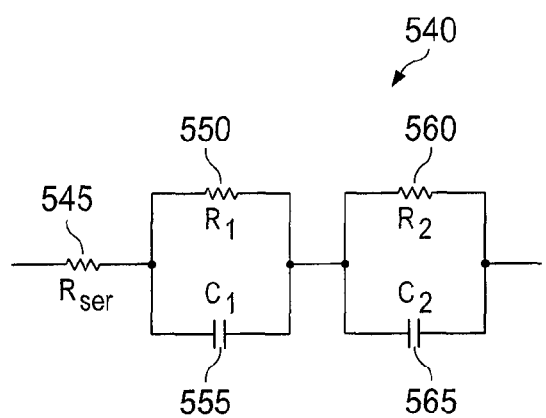

SYSTEMS AND METHODS FOR DETERMINING BATTERY PARAMETERS FOLLOWING ACTIVE OPERATION OF THE BATTERY

TECHNICAL FIELD

The present disclosure is generally related to electronics and, more particularly, is related to systems and methods for determining battery parameters following active operation of the battery.

BACKGROUND

Measuring the parameters of a battery can be hindered due to loads that are applied to the battery. The parameters of an equivalent circuit can be measured while applying a predefined constant or variable load to the battery and analyzing the time domain or frequency domain response. However, during operation of a battery powered device, application of significant additional loads are undesirable due to possible distortion of operation. Additionally, a device for applying the additional load can be costly and/or complex. Moreover, the additional power usage may be unacceptable, especially in portable devices. Thus, a heretofore unaddressed need exists in the industry to address the aforementioned deficiencies and inadequacies.

SUMMARY

Example embodiments of the present disclosure provide a system and method for determining battery parameters following active operation of the battery.

Briefly described, in architecture, one example embodiment of the system, among others, can be implemented as follows: a processor configured to: monitor a load current of a battery; determine when the load current is less than a threshold current; fit a voltage response of the battery associated with the load current to a model function of the battery to obtain parameters of an equivalent battery circuit; and memory configured to store the parameters.

Embodiments of the present disclosure can also be viewed as providing methods for determining battery parameters following active operation of the battery. In this regard, one embodiment of such a method, among others, can be broadly summarized by the following: determining a model function of a battery; monitoring a load current of the battery; determining when the load current is less than a threshold current; fitting a voltage response of the battery associated with the load current to the model function to obtain parameters of an equivalent battery circuit; and storing the parameters in memory.

Another embodiment of such a method can be broadly summarized by the following: selecting an equivalent circuit for a battery; determining a Laplace domain equation of the equivalent circuit; determining a time domain function for a load current of the equivalent circuit; determining a Laplace transform of the time domain function for the load current of the equivalent circuit; determining a voltage response of the equivalent circuit; determining a time domain response function of the voltage response; and determining parameters of the equivalent circuit by fitting the time domain response function to voltage relaxation data obtained after a termination of a load pulse.

BRIEF DESCRIPTION OF THE DRAWINGS

FIG. 4 is a signal diagram of an example embodiment of a battery voltage experiencing a pulsed load for use in the graph of FIG. 3.

FIG. 5*a* is an example embodiment of an equivalent circuit used for analysis of relaxation profile for use in the method of FIG. 2.

FIG. 5*b* is an example embodiment of an equivalent circuit used for analysis of relaxation profile for use in the method of FIG. 2.

DETAILED DESCRIPTION

Example embodiments will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Embodiments of the present disclosure can be viewed as providing methods for acceleration of open circuit voltage acquisition. Due to prolonged relaxation time of a battery, open circuit voltage is not available immediately after termination of load. IR drop may not disappear immediately and may still distort the open circuit voltage measurement for a period of time. However, when parameters of electrical equivalent circuits of the battery are available, this remaining IR drop can be corrected. Parameters are subsequently (or simultaneously) used for correcting IR drop during battery relaxation for finding a corrected open circuit voltage value.

Alternatively, parameters can be used for predicting battery voltage response to the load (discharge simulation), and, further, used for battery capacity indication. Furthermore, parameters can be used for reporting state of health of the battery. They can also be used for detecting a potentially unsafe state of the battery, detection of which can be reported to the end user or used by the system to disable battery operation.

Figure 1:
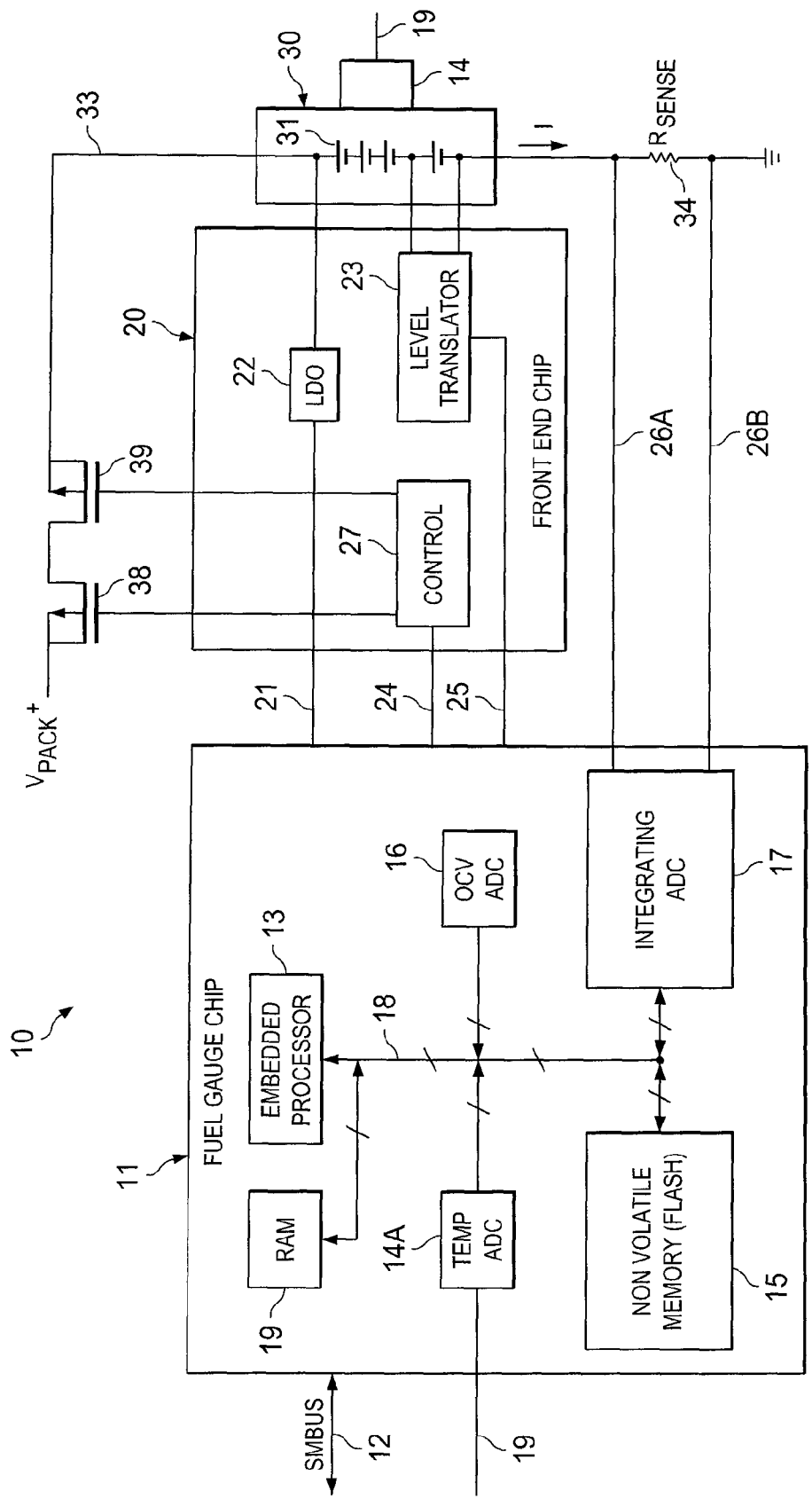
FIG. 1 is a system view of an example embodiment of a gas gauge device for determining battery parameters following active operation of the battery.

Referring to FIG. 1, battery fuel gauge system 10 includes battery fuel gauge integrated circuit chip 11 that includes embedded processor 13 coupled by bidirectional digital bus 18 to temperature sensor circuit 14, nonvolatile memory 15, random access memory (RAM) 19, analog-to-digital converter (ADC) 16, and integrating analog-to-digital converter 17. Temperature sensor circuit 14 is coupled to external sensor 19 which is directly attached to battery 30 shown in FIG. 1. Nonvolatile memory 15 could be a conventional flash memory, ADC 16 and ADC 17 both can be conventional analog-to-digital converters, and embedded processor 13 can, for example, be a commercially available 8 MHz processor having an 8-bit central processing unit (CPU) and a RISC architecture. Various suitable embedded processors that are commercially available can be utilized. For example, the MSP430 microprocessor is capable of performing the necessary computations, or an embedded processor such as the one used in the BQ8012 fuel gauge chip can be used.

Fuel gauge chip 11 is coupled to standard SMBus (smart bus) 12 by means of which the fuel gauge chip 11 communicates with another processor (not shown) in accordance with a suitable communications protocol. A conventional interface circuit (not shown) is coupled between SMBus 12 and digital bus 18. Fuel gauge chip 11 is powered by a supply voltage on conductor 21, which is connected to the output of low dropout (LDO) voltage regulator circuit 22 which is included in "front end" integrated circuit chip 20. Bidirectional digital bus 24 is coupled between conventional digital interface circuitry (not shown) in accordance with a standard I2IC in integrated circuit 11 and control circuitry 27 in fuel gauge chip 20.

Front-end chip 20 also includes level translator circuit 23 that is coupled by suitable circuitry (not shown) to measure the voltage across one (or more) of individual lithium-ion cells 31 included in battery 30 which is used to provide power to a utilization device (not shown) coupled between the "battery pack" terminals V+ and ground. Level translator circuit 23 produces an output that is connected by conductor 25 to the analog input of ADC 16 in integrated circuit 11. ADC 16 converts the cell voltage to a digital equivalent that can be accessed via digital bus 18 by embedded processor 13.

The total voltage across battery 30 (which can be considered to be equal to the voltage across one of the cells multiplied by the number of cells connected in series) is applied to an input of voltage regulator 22. A 1-100 milli-ohm sense resistor 34 is coupled between ground and the (−) terminal of battery 30, and the voltage across sense resistor 34 is applied as an input to integrating ADC 17, which converts the voltage across sense resistor 34 to a digital representation of the battery current flowing through sense resistor 34. The (+) terminal of battery 30 is connected by conductor 33 to the source of power transistor 39, the gate of which is connected to control circuit 27 and front end chip 20. The drain of power transistor 39 is connected to the drain of power transistor 38, the source of transistor 39 is connected to the battery pack voltage V+, and the gate of transistor 39 is connected to control circuitry 27. The gate of transistors 38 and 39 are controlled in response to signals received by front-end chip 20 from embedded processor 13 via bus 24. Transistor 39 is a discharging transistor and transistor 38 is a charging transistor. Front-end chip 20 includes conventional interface and control circuitry 27 coupled to bidirectional digital bus 24 in accordance with the standard I2IC protocol in order to control power transistors 38 and 39.

Various information can be sent from fuel gauge chip 11 via digital bus 24 to front-end chip 20 in order to set various levels and to transmit various safety/control information to front-end chip 20, for example to turn the power transistors 38 and 39 on and off under appropriate conditions.

Response of battery voltage to load application or load release is time dependent. Modeling of this time dependence can provide significant advantages in fuel gauging implementation, for example, to significantly reduce the waiting time before measured voltages can be used for state of charge (SOC) correlation and to improve the accuracy of the prediction of run-time for devices that drain a battery in short high-current pulses.

Such parameters can be used for detecting and preventing possible safety issues as well, such as internal short-circuit conditions by contamination particles, damage, shift or rupture of electrode separator, and penetration of separator by dendrite growth, among others. Equivalent circuit modeling can be used to predict time-dependence of battery voltage response. However, use of static values of circuit elements leads to large inaccuracies due to cell to cell variations and changes due to battery aging, among others.

When the load of a battery powered device is removed or significantly reduced, the voltage response may be recorded or analyzed in real time. The parameters of a battery's equivalent circuit can be found by fitting recorded or real time voltage response to a time domain model function. The time domain model function may describe the equivalent circuit voltage response to the load transition through equivalent circuit parameters. The model function may account for a duration of a load application prior to a transition as well as for values of the load before and after the transition. The model function may factor in the battery type or chemistry (e.g., Li-Ion, NiMH, NiCd, Pb-Acid, etc.), and the charge and discharge profiles of a particular battery type. Age of the battery, frequency of load, frequency of charge, and charge rate are other non-limiting factors for the model.

Figure 2:
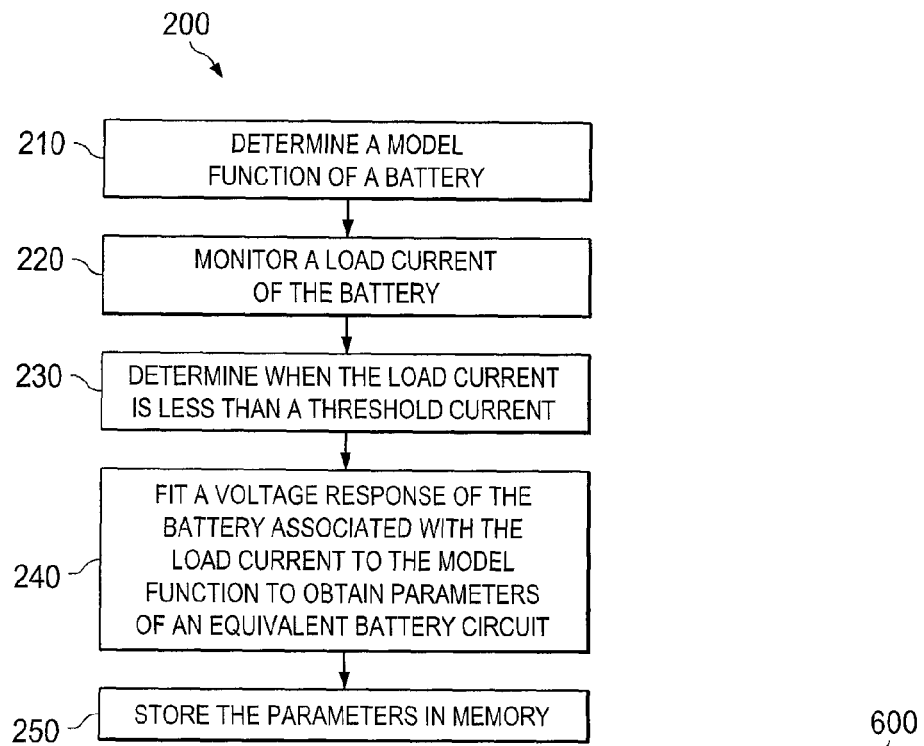
FIG. 2 is a flow chart of a method for determining battery parameters following active operation of the battery using the gas gauge of FIG. 1.

Embedded processor 13 executes a program represented by the flowchart 200 of FIG. 2 to accurately calculate battery parameters. In block 210, a model function of a battery is determined. In block 220, a load current of the battery is monitored. In block 230, the time at which the load current falls below a threshold current is determined. In block 240, a voltage response of the battery associated with the load current is fitted to the model function to obtain parameters of an equivalent battery circuit. In block 250, the parameters are stored in memory.

Figure 3:
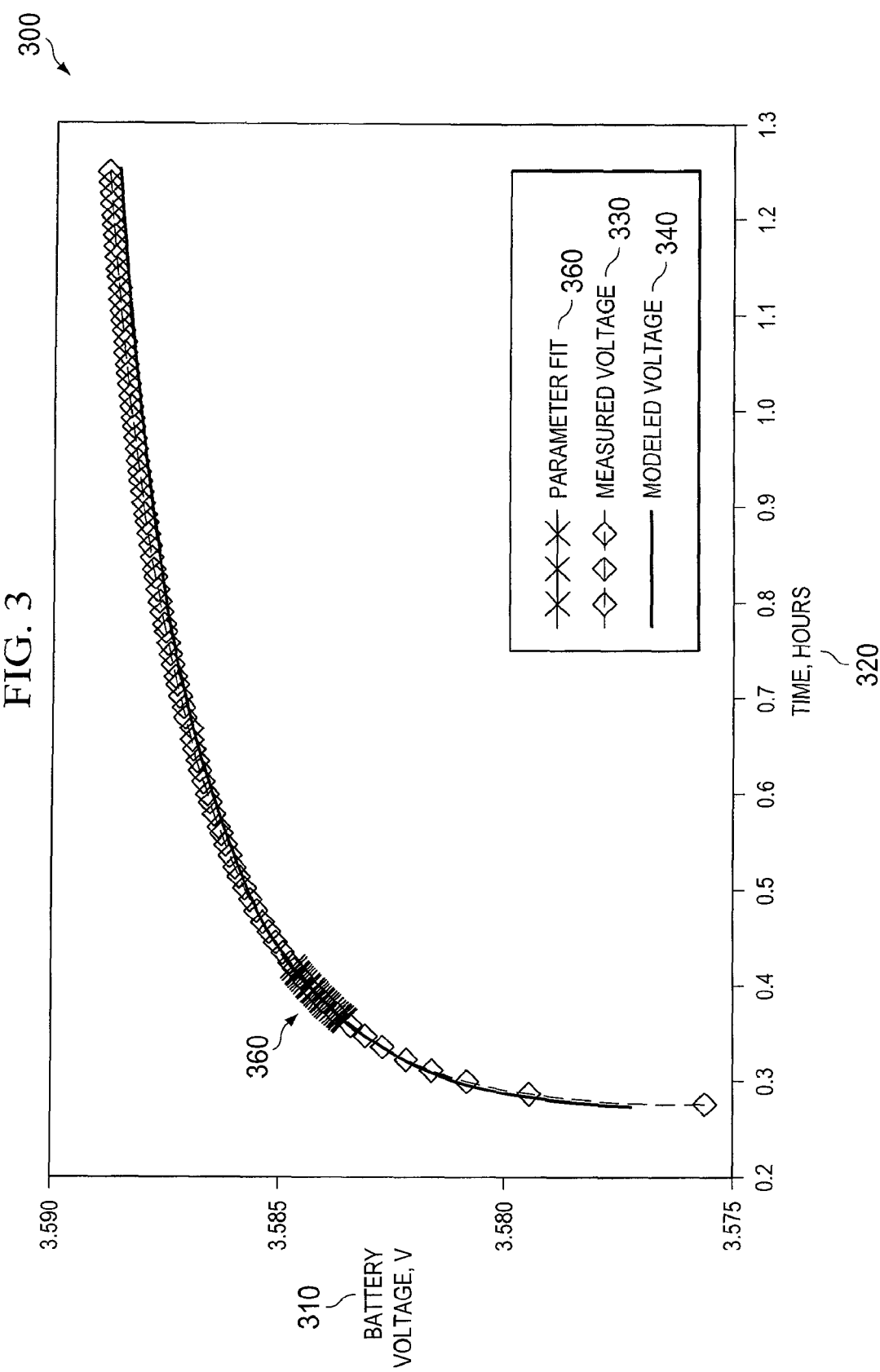
FIG. 3 is a graph of an example embodiment of a measured voltage profile of a battery after a load disconnect, a modeled voltage profile, and a parameter fit for use in the method of FIG. 2.

FIG. 3 provides graph 300 of battery voltage 310 in volts versus time 320 in hours. A typical battery voltage is measured over time and plotted as measured voltage 330. The battery can then be assumed to have a profile which is represented by modeled voltage 340. The battery parameters can then be obtained by fitting a battery response function to modeled voltage 340 to result in parameter fit 360.

When a voltage reading is collected to correlate the state of charge in the battery, the time for the voltage level of the battery to settle may be longer than desired. Some applications will not have the opportunity for such a period of rest to allow the state of charge to settle. In some applications (cell phones, digital cameras, among others), it may be acceptable to reduce accuracy for the benefit of shortening the time requirement for the measurement. For example, the relaxation profile in FIG. 4 shows that full relaxation is not reached even after 1.3 hrs, but fit of just 500 sec of data already allows the acquisition of model parameters, which, in turn, allows the prediction of the remaining relaxation profile with sufficient accuracy.

FIG. 4 provides an example of voltage change 400 during multiple discharge/relaxation intervals that can occur during a battery powered device operation. It is depicted as voltage 410 in volts versus time 420 in seconds. Voltage 430 represents a steady state voltage. Voltage 440 represents an excitation pulse (e.g., a load on the battery) that lasts for $t_{pulse}$. Voltage 450 represents the voltage as the battery enters a relaxation state. The relaxation time is the time the voltage takes to recover from the loaded condition and return to a steady state. Voltage 460 represents another excitation pulse, and voltage 570 represents the voltage as the battery recovers from the excitation pulse and returns to a steady state.

The choice of the equivalent circuit to model the battery response may depend on the computational resources and the memory, among other conditions. The most physically relevant models may result in highest accuracy, but may need more resources. Results in the example embodiment of FIG. 3 are obtained using equivalent circuit 510, as provided in FIG. 5a, which includes infinite length diffusion element 530 in series with resistor 520. This embodiment has an advantage of high simplicity. Another example embodiment of an equivalent circuit includes single or multiple RC elements in series, as provided in FIG. 5b. In equivalent circuit 540, series resistor 545 is in series with RC element 550, 555, and RC element 560, 565. Other example embodiments may include a combination of diffusion and RC elements, and a transmission line, among others. The equivalent battery circuit may be selected based on quality of the fit, present state of charge, age of the battery, measurement of time, voltage, current, and temperature among other factors.

Figure 6:
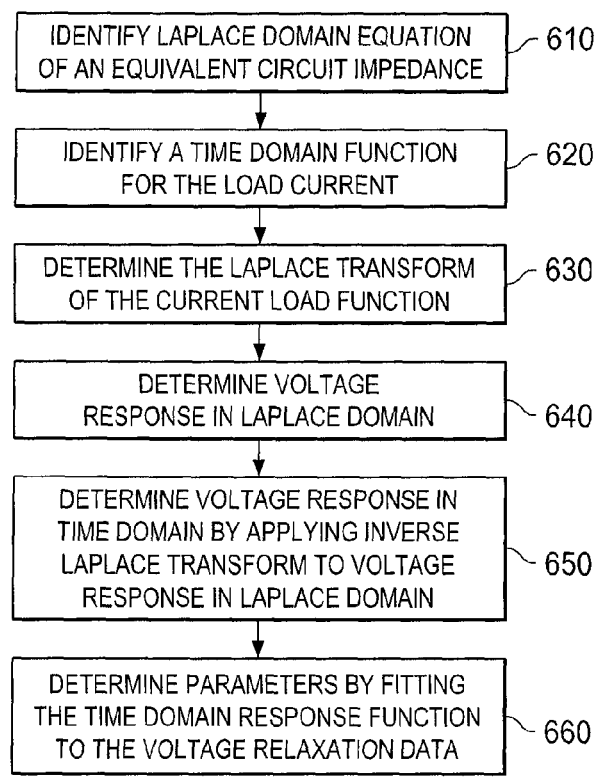
FIG. 6 is a flow chart of a method for determining battery parameters following active operation of the battery using the gas gauge of FIG. 1.

Once an equivalent circuit is identified, the time domain response to a load can be found using method 600 of FIG. 6. In block 610, the Laplace domain equation of an equivalent circuit impedance is identified using common techniques. For example, for a number of n RC elements in series with a resistor, the equation is:

$$Z(s) = R_{ser} + \sum_{i=0}^{n} \frac{1}{\frac{1}{R_i} + s \cdot C_i}$$ Eqn. 1 where "s" is a complex frequency variable, and "n" is the number of RC elements.

In block 620, a time domain function for the load current is identified. For example, for current pulse/interrupt as indicated in FIG. 6, this function is $$i(t) = I \cdot (\Phi(t) - \Phi(t - t_{pulse}))$$ Eqn. 2 where $\Phi(t)$ is Heaviside step function, which means 0 for times below 0, and 1 for times at and above zero.

In block 630, the Laplace transform of current load function is determined, as exemplified in Eqn. 2:

$$I(s) = \frac{I}{s} \cdot (1 - e^{-t_{pulse} \cdot s})$$ Eqn. 3

In block 640, the voltage response in the Laplace domain is determined by multiplying the circuit impedance function exemplified in Eqn. 1 with the load function in Laplace domain, exemplified in Eqn. 3:

$$V(s) = I(s) \cdot Z(s)$$ Eqn. 4

In block 650, the time domain response function is determined by performing an inverse Laplace transform of the voltage function in the Laplace domain, exemplified by Eqn. 4

$$v(t) = R_i \cdot I \cdot \sum_{i=0}^{n} e^{\frac{-t}{R_i \cdot C_i}} \cdot \left(e^{\frac{t_{pulse}}{R_i \cdot C_i}} - 1\right) + A(t, I) \cdot (1 - \Phi(t - t_{pulse}))$$ Eqn. 5

In the analysis of the relaxation after pulse termination, the form of A(t,I) does not matter because at the moment of the pulse termination, the Heaviside function $\phi(t-t_{pulse})$ becomes zero.

As time domain response function v(t) of the chosen circuit is found as exemplified in Eqn. 5, in block 660, the parameters of the chosen circuit can be found by fitting the function v(t) to the voltage relaxation data obtained after pulse termination. Such a fit is shown, for example, in FIG. 3 as the "parameter fit" line. It is preferable to chose equivalent circuits for which a response to load termination can be linearized such that a fit by using linear regression may be used, which is much easier to implement. However, with sufficient computing resources more complex circuits with responses that are not linearizeable can also be used, under utilization of a non-linear fit. Obtained parameters may then be used for modeling battery response for capacity gauging purposes (such as predicting pulse response, relaxation after pulse, etc.) or for monitoring of battery state of health or safety.

For example, using a similar approach to method 600 of FIG. 6, a response function to a pulse excitation can be derived and used with the same parameters and used to predict remaining run-time. Alternatively, the same load termination response function used for the fit, can be extrapolated to longer times to predict voltage after prolonged relaxation, as shown in the "predicted voltage" line of FIG. 3.

The logic of the example embodiment(s) can be implemented in hardware, software, firmware, or a combination thereof. In example embodiments, the logic is implemented in software or firmware that is stored in a memory, such as non-volatile memory 15 of FIG. 1, and that is executed by a suitable instruction execution system, such as embedded processor 13 of FIG. 1. If implemented in hardware, as in an alternative embodiment, the logic can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In addition, the scope of the present disclosure includes embodying the functionality of the example embodiments in logic embodied in hardware or software-configured mediums.

Software embodiments, which comprise an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, or communicate the program for use by or in connection with the instruction execution system, system, or device. The computer readable medium can be, for example but not limited to, an electronic, magnetic, optical, electromagnetic, infrared, or semiconductor system, apparatus, or device.

More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), and a portable compact disc read-only memory (CDROM) (optical). In addition, the scope of the present disclosure includes embodying the functionality of the example embodiments of the present disclosure in logic embodied in hardware or software-configured mediums.

Any process descriptions or blocks in flow charts should be understood as representing modules, segments, or portions of code which include one or more executable instructions for implementing specific logical functions or steps in the process, and alternate implementations are included within the scope of the example embodiments in which functions may be executed out of order from that shown or discussed, including substantially concurrently or in reverse order, depending on the functionality involved. In addition, the process descriptions or blocks in flow charts should be understood as representing decisions made by a hardware structure such as a state machine known to those skilled in the art.

Therefore, at least the following is claimed:

1. A method comprising:
   determining a model function of a battery describing voltage relaxation response after load termination;
   monitoring a load current of the battery;
   determining when the load current is less than a threshold current indicating load termination;
   only in response to load termination adapting parameters of a voltage response of the battery associated with the load current to achieve the best fit to the model function to obtain parameters of an equivalent battery circuit; and
   storing the parameters in memory.

2. The method of claim 1, wherein the model function factors a duration of an applied load prior to a transition of the load current falling below the threshold current.

3. The method of claim 1, wherein the model function factors values of the load before and after a transition of the load current falling below the threshold current.

4. The method of claim 1, wherein the model function factors the battery chemistry.

5. The method of claim 1, wherein the model-function comprises at least one of a time-domain function and a frequency domain function.

6. The method of claim 1, wherein the voltage response of the battery comprises at least one of a recorded voltage and a real-time voltage.

7. The method of claim 1, wherein the parameters of the equivalent battery circuit are determined by a linear fit to the voltage response.

8. The method of claim 1, wherein the parameters of the equivalent battery circuit are determined by a non-linear fit to the voltage response.

9. The method of claim 1, wherein the equivalent battery circuit comprises at least one of:
   a) an infinite diffusion element in series with a resistor;
   b) a transmission line; and
   c) one or more RC elements connected in series with a series resistor.

10. The method of claim 1, wherein the equivalent battery circuit is selected based on at least one of quality of the fit, present state of charge, age of the battery, and temperature.

11. A non-transitory computer readable medium containing computer instructions stored therein for causing a computer processor to perform the steps comprising:
    selecting an equivalent circuit for a battery describing voltage relaxation response after load termination;
    determining a Laplace domain equation of the equivalent circuit;
    determining a time domain function for a load current of the equivalent circuit;
    determining a Laplace transform of the time domain function for the load current of the equivalent circuit;
    determining a voltage response of the equivalent circuit;
    determining a time domain response function of the voltage response; and
    determining parameters of the equivalent circuit by fitting the time domain response function to voltage relaxation data obtained only after a termination of a load pulse.

12. The method of claim 11, wherein the voltage response of the equivalent circuit is determined by multiplying an impedance function of the equivalent circuit with the Laplace transform of the time domain function for the load current of the equivalent circuit.

13. The method of claim 11, wherein the time domain response function of the voltage response is determined by performing an inverse Laplace transform of the voltage response.

14. The method of claim 11, where the equivalent circuit is selected to provide a linear fit.

15. The method of claim 11, further comprising determining battery capacity using the parameters of the equivalent circuit.

16. A system comprising:
    a processor configured to: monitor a load current of a battery; determine when the load current is less than a threshold current indicating load termination;
    adapt parameters of a voltage response of the battery associated with the load current to a model function of the battery to achieve the best fit only after load termination to obtain parameters of an equivalent battery circuit; and
    memory configured to store the parameters.

17. The system of claim 16, wherein the model function factors a duration of an applied load prior to a transition of the load current falling below the threshold current.

18. The system of claim 16, wherein the model function factors values of the load before and after a transition of the load current falling below the threshold current.

19. The system of claim 16, wherein the model function factors the battery chemistry.

20. The system of claim 16, wherein the voltage response of the battery comprises one of a recorded voltage and a real-time voltage.

* * * * *